United States Patent
Fong et al.

(10) Patent No.: US 10,573,997 B1
(45) Date of Patent: Feb. 25, 2020

(54) POWER SUPPLY UNIT WITH CONNECTOR PROTECTION CIRCUIT

(71) Applicant: Microsoft Technology Licensing, LLC, Redmond, WA (US)

(72) Inventors: Chee Kiong Fong, Saratoga, CA (US); Sujuan Tang, Zhuhai (CN); Richard F. Johnson, Redmond, WA (US); Suet Fong Tin, Redmond, WA (US); Geoffrey Jason Shew, Redmond, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

(21) Appl. No.: 16/422,157

(22) Filed: May 24, 2019

(51) Int. Cl.
| | |
|---|---|
| *H01R 13/641* | (2006.01) |
| *H02H 9/04* | (2006.01) |
| *H03K 17/0812* | (2006.01) |

(52) U.S. Cl.
CPC ........... *H01R 13/641* (2013.01); *H02H 9/042* (2013.01); *H03K 17/0812* (2013.01)

(58) Field of Classification Search
CPC .. H01R 13/641; H02H 9/042; H03K 17/0812; H02M 3/156–158; H02M 3/1584; H02M 3/1588
USPC ................................................. 323/271–285
See application file for complete search history.

(56) References Cited

U.S. PATENT DOCUMENTS

| | | | | |
|---|---|---|---|---|
| 4,698,582 A | * | 10/1987 | Braun | ............ H03K 17/08126 323/285 |
| 5,086,364 A | * | 2/1992 | Leipold | ............ H03K 17/0822 361/18 |
| 6,097,582 A | * | 8/2000 | John | .................. H03K 17/165 361/79 |
| 6,107,926 A | * | 8/2000 | Kifuku | ................ B62D 5/0487 340/650 |
| 6,700,766 B2 | | 3/2004 | Sato | |
| 7,215,517 B2 | | 5/2007 | Takamatsu | |
| 9,608,617 B2 | * | 3/2017 | Yasusaka | ........... H03K 17/0822 |

(Continued)

FOREIGN PATENT DOCUMENTS

CN 104485647 A 4/2015

*Primary Examiner* — Yemane Mehari
(74) *Attorney, Agent, or Firm* — Alleman Hall Creasman & Tuttle LLP

(57) ABSTRACT

A power supply unit having improved resistance to overheating caused by electrically conductive environmental contamination of electrical contacts of a connector of the power supply unit is disclosed. In one example, the connector includes one or more electrical contacts configured to receive one or more signals that indicate the connector is connected to an electronic device. The power supply unit includes a protection circuit that is configured to electrically disconnect the power supply unit from the connector based on detecting that a voltage on at least one of the one or more electrical contacts is greater than an expected/reference voltage. The higher than expected voltage may indicate that electrically conductive contamination has created a short between different electrical contacts of the connector. The power supply unit may be disabled based on detection of the electrically conductive contamination in order to prevent overheating and/or degradation of the connector.

20 Claims, 4 Drawing Sheets

(56) References Cited

U.S. PATENT DOCUMENTS

2012/0299566 A1* 11/2012 Hsu .................. H02M 3/33523
   323/282
2019/0109480 A1*  4/2019 Hsu ...................... H02J 7/0036

* cited by examiner

POWER SUPPLY UNIT WITH CONNECTOR PROTECTION CIRCUIT

BACKGROUND

A connector for a power supply unit may be selectively connected to an electronic device (i.e., a "load"), such as a computer tablet, a laptop, or a smartphone. The connector is equipped with electrically conductive power and ground electrical contacts that may selectively electrically connect with the electronic device in order to transfer electrical current from the power supply unit to the electronic device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A power supply unit having improved resistance to overheating caused by electrically conductive environmental contamination of electrical contacts of a connector of the power supply unit is disclosed. In one example, the connector includes one or more electrical contacts configured to receive one or more signals that indicate the connector is connected to an electronic device. The power supply unit includes a protection circuit that is configured to electrically disconnect the power supply unit from the connector based on detecting that a voltage on at least one of the one or more electrical contacts is greater than an expected/reference voltage. The higher than expected voltage may indicate that electrically conductive contamination has created a short between different electrical contacts of the connector. The power supply unit may be disabled based on detection the electrically conductive contamination in order to prevent overheating and/or degradation of the connector.

DETAILED DESCRIPTION

A power supply unit may be selectively connected to an electronic device to deliver electrical current from the power supply unit to the electronic device. In some examples, a connector of the power supply unit may be equipped with an "enable signal" electrical contact that indicates when the connector is connected to the load. The enable signal instructs the power supply unit to deliver full power to the connected electronic device. The enable signal is designed to prevent the electronic device from receiving full power if power electrical contacts of the connector short to ground electrical contacts of the connector.

However, such connectors may be susceptible to environmental electrically conductive contamination. As one example, electrical contacts of a connector may come in contact with a conductive liquid (e.g., water, soup, soda). Subsequently, trace elements from the conductive liquid, such as electrolytes (e.g., salt, chlorine) may be deposited on the electrical contacts of the connector. Such deposits may produce electrical shorts, or partially shorted pins. As one example, a short or partial short between a power electrical contacts and the enable electrical contacts caused by electrically conductive contamination may apply a voltage higher than an expected enable voltage from the enable signal to the enable electrical contacts. The higher than expected enable voltage may cause the connector to overheat and/or degrade by turning on full power to a short or partial short between power and ground electrical contacts. As another example, a short or partial short between a power electrical contacts and a ground electrical contacts caused by electrically conductive contamination may provide a resistive current path that may cause the connector to overheat and/or degrade.

Accordingly, the present disclosure is directed to a power supply unit having improved resistance to overheating due to environmental electrically conductive contamination. The power supply unit may be configured to detect one or more signals at one or more electrical contacts of a connector of the power supply unit. The one or more signals may indicate that an electronic device is connected to the power supply unit. The one or more signals may have an expected voltage. The power supply unit may be configured to shut down based on a voltage on at least one of the one or more electrical contacts being greater than the expected voltage. By doing so, the likelihood of the connector of the power supply unit overheating and/or degrading may be reduced.

Figure 1:
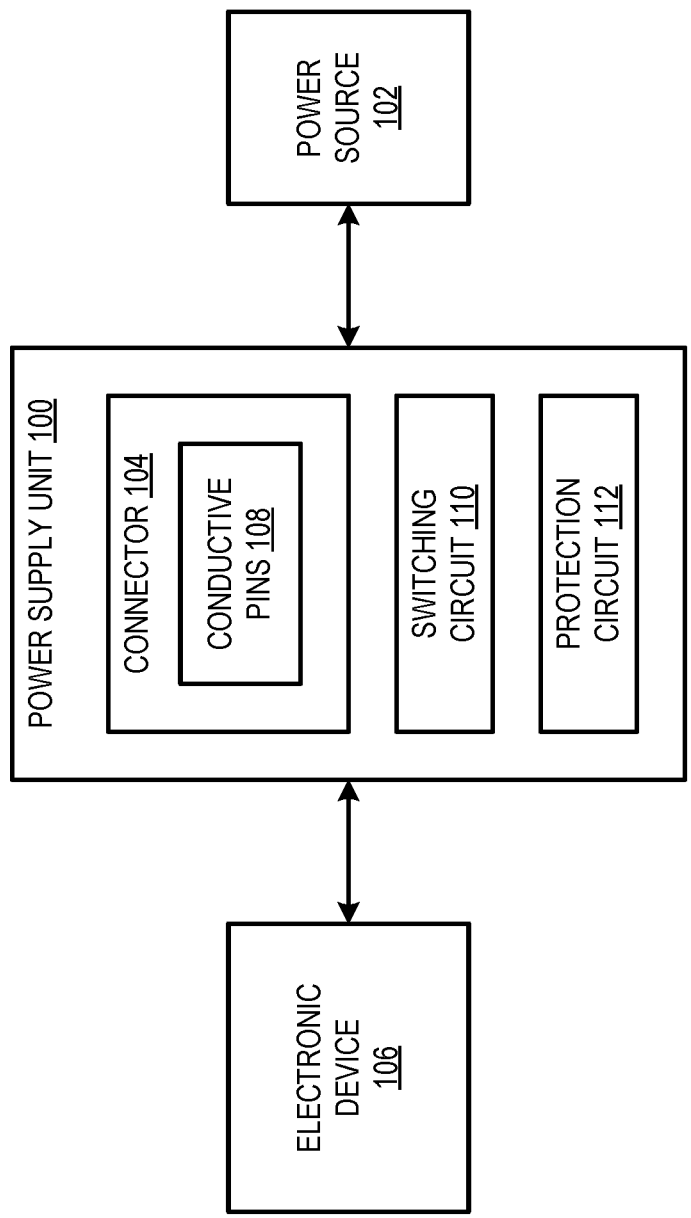
FIG. 1 is a schematic block diagram of an example power supply unit.

FIG. 1 is a schematic block diagram of an example power supply unit 100. The power supply unit 100 may be selectively connected to a power source 102 to receive energy in the form of electrical current from the power source 102. The power source 102 may take any suitable form. Non-limiting examples of suitable power sources include an electrical outlet connected to an electric power grid, a battery, a fuel cell, a generator, an alternator, and a solar power converter.

The power supply unit 100 may be electrically connected to a connector 104 via hardwired circuit connections. In some examples, such hardwired circuit connections may be incorporated into a power cable connected between the power supply unit 100 and the connector 104. The connector 104 may be configured to deliver electrical current output from the power supply unit 100 to an electronic device (i.e., a load) 106 that is selectively electrically connected to the connector 104. When the electronic device 106 is connected to the connector 104, the power supply unit 100 may be configured to convert electric current from the power source 102 to a suitable voltage, current, and frequency to power the connected electronic device 106. The electronic device 106 may take any suitable form. Non-limiting examples of suitable electronic devices include a tablet computer, a laptop computer, a desktop computer, a smartphone, a game console, an audio device, a display device, and a battery powered device.

The connector 104 may be selectively connectable to the electronic device 106 through a plurality of electrical contacts in the form of conductive pins 108. The electrical contacts of the connector 104 may take any suitable form. Non-limiting examples of electrical contacts of the connector 104 include conductive leads or wires, screws, clips, plugs, sockets, jacks, and rings. For the purpose of this disclosure, the electrical contacts of the connector 104 are referred to herein below as "pins". As one example, the plurality of conductive pins 108 may include at least one power pin, at least one ground pin, and one or more additional pins. In some examples, an interface between the connector 104 and the electronic device 106 may be implemented as a male/female or plug/slot connection. The one or more additional pins may receive signal(s) that indicates that the electronic device 106 is connected to the connector 104. In some examples, the one or more additional pins may include one or more enable pins configured to receive an enable signal. In some examples, the one or more additional pins may include one or more data pins configured to receive one or more data signals.

The power supply 100 may include a switching circuit 110 configured to switch the power supply unit 100 between operating in a low-power mode and a high-power mode based on whether or not a signal is detected at the at least one of the one or more additional pins of the connector 104. Under proper (e.g., non-contaminated) operating conditions, the signal may indicate whether the electronic device 106 is electrically connected to the connector 104. If the switching circuit 110 does not detect the signal, such as when the connector 104 is not connected to the electronic device 106, then the switching circuit 110 causes the power supply unit 100 to operate in the low-power mode. In the low-power mode, an electrical current output from power pin(s) of the connector 104 is limited to little or no electrical current. If the switching circuit 110 detects the signal, then the switching circuit 110 switches the power supply unit 100 to operate in the high-power mode. In the high-power mode, an electrical current corresponding to the full power for the electronic device 106 is provided from the power supply unit 100, through the connector 104 to the electronic device 106. Once the switching circuit 110 has switched the power supply unit 100 to operate in the high-power mode, the power supply unit 100 may remain operating in the high-power mode until the switching circuit 110 no longer detects the signal. At which point, the switching circuit 110 switches the power supply unit 100 to operate in the low-power mode.

The plurality of conductive pins 108 of the connector 104 may be exposed to the environment, such that electrically conductive contaminating material, such as electrolytes (e.g., salt, chlorine), may be deposited on the conductive pins 108. Such electrically conductive contamination deposits may produce electrical shorts, or partially shorted pins within the connector 104. To protect the connector 104 from overheating and/or degrading as a result of contamination induced shorts or partially shorted pins, the power supply unit 100 includes a protection circuit 112. The protection circuit 112 is configured to compare a voltage at one of the one or more additional pins to a reference voltage corresponding to an expected voltage of the signal that indicates the electronic device 106 is connected to the connector 104 for proper (e.g., non-contaminated) operating conditions of the connector 104. The expected voltage may be substantially different from the supply voltage of the power supply unit 100. For example, the reference voltage may be less than or equal to 3.3 volts and the supply voltage may be greater than 3.3 volts. In one particular example, the supply voltage is 15 volts and the expected voltage is 3.3 volts. The supply voltage and the reference voltage may be any suitable voltages. Operating conditions where the voltage at the additional pin connected to the protection circuit 112 is greater than the reference voltage may indicate that the connector 104 has a short or partially shorted pins potentially as a result of contamination. The protection circuit 112 may be configured to electrically disconnect the power supply unit 100 from the connector 104 in response to the voltage at the additional pin connected to the protection circuit 112 being greater than the reference voltage. In one example, the protection circuit 112 electrically disconnects the power supply unit 100 from the connector 104 by shutting of the power supply unit 100. In another example, a switching circuit positioned intermediate the power supply unit 100 and the connector 104 may be used to electrically disconnect the power supply unit 100 from the connector 104. This intervening action prevents the full power of the power supply unit 100 from being delivered to the pins 108 of the connector 104. In this way, the connector 104 may be prevented from overheating and/or degrading. Note that the actions of the protection circuit 112 may override the actions of the switching circuit 110 to protect the power supply unit 100 and/or the connector 104.

Figure 2:
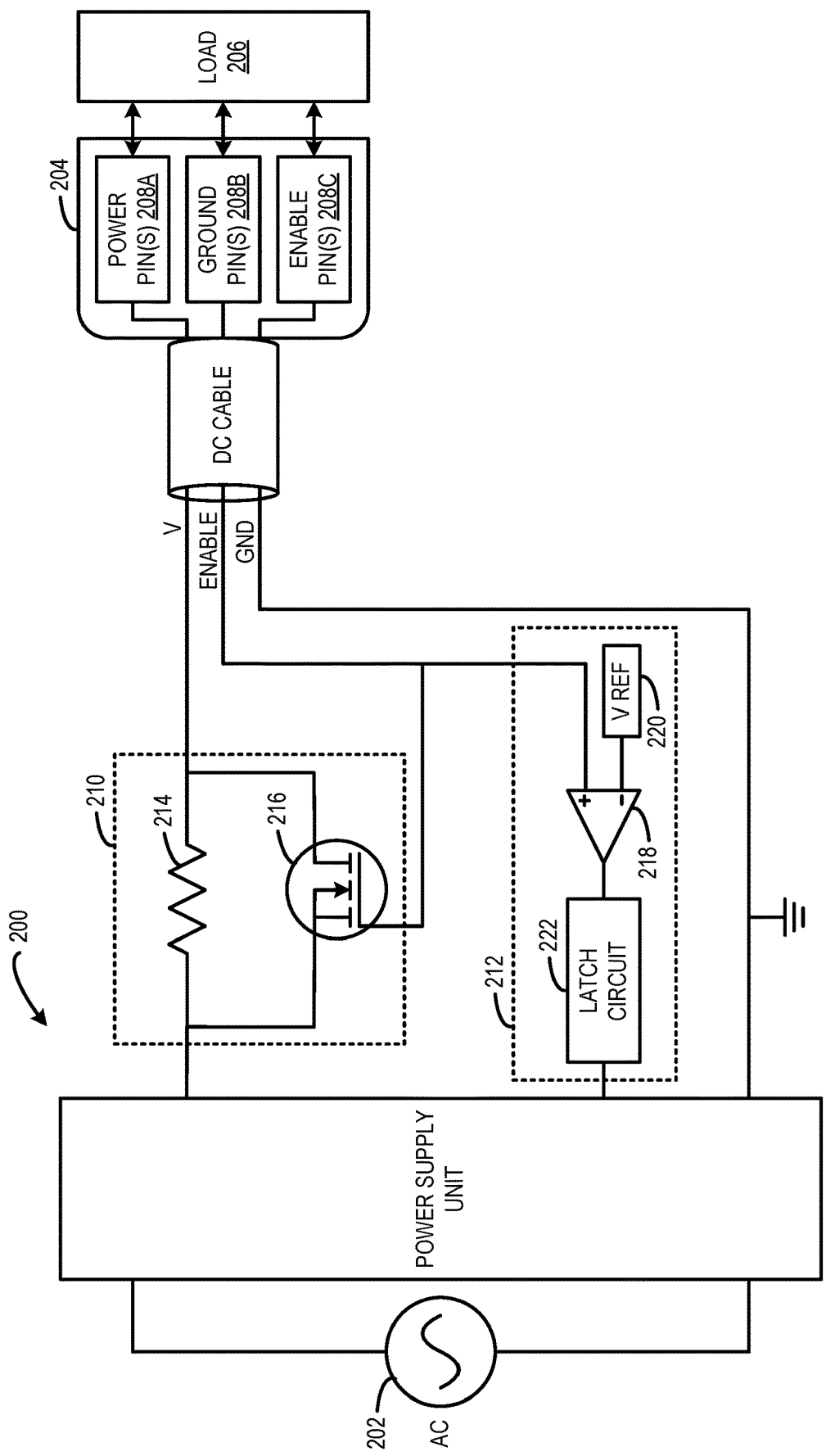
FIG. 2 schematically shows an example configuration of a power supply unit.

FIG. 2 schematically shows an example configuration of a power supply unit 200. The power supply unit 200 may be selectively electrically connected to a power source 202. The power supply unit 200 includes a connector 204 configured to selectively connect to an electronic device 206 (depicted herein as a "load") via a plurality of electrically conductive pins 208. In particular, the connector 204 includes one or more power pins 208A, one or more ground pins 208B connected to a ground reference, and one or more enable pins 208C.

The power supply unit 200 includes a switching circuit 210 and a protection circuit 212. The switching circuit 210 is electrically connected between the power supply unit 200 and the power pin(s) 208A. The switching circuit 210 is further electrically connected to the enable pin(s) 208C. The switching circuit 210 includes a current limiting resistor 214 electrically connected between the power supply unit 200 and the power pin(s) 208A. The current limiting resistor 214 is connected in series with the power pin(s) 208A. The current limiting resistor 214 is configured to limit a supply current from being provided from the power supply unit 200 to the power pin(s) 208A. The current limiting resistor 214 may be configured to have any suitable resistance that limits the supply current output from the power supply unit 200.

The switching circuit 210 includes a transistor 216 electrically connected in parallel with the current limiting resister 214. The transistor 216 includes a source, a gate, and a drain. The source is electrically connected between the power supply unit 200 and the current limiting resistor 214. The drain is electrically connected between the current limiting resistor 214 and the power pin(s) 208A. The gate is electrically connected to the enable pin(s) 208C. In accordance with such an arrangement, the transistor 216 is configured to turn on in response to the enable voltage of the enable signal at the enable pin(s) 208C being greater than a threshold voltage (e.g., 1V) of the transistor 216. When the transistor 216 turns on, the current limiting resistor 214 is shorted and the supply current from the power supply unit 200 is allowed to flow through the transistor 216 to the power pin(s) 208A. In one example, the full power of the power supply unit 200 is 15 volts. It will be appreciated that the full power output from power supply unit 200 may have any suitable voltage.

In the depicted configuration, the switching circuit 210 is configured to limit the supply current from being provided from the power supply unit 200 to the power pin(s) 208A based at least in part on the enable signal not being detected at the enable pin(s) 208C. Additionally, the switching circuit 210 is configured to allow the supply current to be supplied from the power supply unit 200 to the power pin(s) 208A based at least in part on the enable signal being detected at the enable pin(s) 208C.

The protection circuit 212 is electrically connected between the power supply unit 200 and the enable pin(s) 208C. The protection circuit 212 includes a comparator 218 including a first input and a second input. The comparator 218 may take any suitable form. The first input is electrically connected to the enable pin(s) 208C. The second input is electrically connected to a reference voltage 220. The reference voltage 220 corresponds to an expected voltage of the enable signal for proper (e.g., non-contaminated) operating conditions of the connector 204. In one particular example, the reference voltage 220 is set at 3.3 volts. It will be appreciated that the reference voltage may be set at any suitable expected voltage for the enable signal. The comparator 218 is configured to compare a voltage detected at the enable pin(s) 208C to the reference voltage 220 and output a digital signal indicating which voltage is greater. For example, the comparator 218 may output a digital signal corresponding to a zero based on the voltage detected at the enable pin(s) 208C being less than or equal to the reference voltage 220, or output a digital signal corresponding to a one based on the voltage detected at the enable pin(s) 208C being greater than the reference voltage 220.

The protection circuit 212 includes a latch circuit 222 electrically connected between the output of the comparator 218 and the power supply unit 200. The latch circuit 222 may take any suitable form. The latch circuit 222 is configured to shut off the power supply unit 200 in response to the comparator 218 outputting a signal indicating that the enable voltage detected at the enable pin(s) 208C is greater than the reference voltage 220. For example, the latch circuit 222 may provide a low signal to the power supply unit 200 for as long as the comparator 218 outputs a signal indicating that the enable voltage is less than or equal to the reference voltage 220. In response to the comparator 218 outputting a signal indicating that the enable voltage is greater than the reference voltage 220, the latch circuit 222 may switch from providing a low signal to providing a high signal to the power supply unit 200. This change from low to high may trigger a shutdown of the power supply unit 200.

In some implementations, the latch circuit 222 optionally may be configured to reset based on a power cycling of the power supply unit 200 and/or based on removing the short or partial short from the connector 204. Such a reset condition may indicate that the connector 204 has been restored to working order and is free from contamination. In other implementations, the connector 204 may remain inoperable once a contamination induced short condition is detected.

In some implementations, a switching circuit may be positioned electrically intermediate the power supply unit 200 and the connector 204. The switching circuit may be configured to electrically disconnect the power supply unit 200 from the connector 204 based at least in part on the enable voltage at the enable pin(s) 208C being greater than the reference voltage 200.

Operation of the power supply unit 200 is characterized by the table depicted below.

| INPUT | | OUTPUT |
|---|---|---|
| ENABLE SIGNAL | COMPARATOR OUTPUT | POWER SUPPLY UNIT |
| 0 V | LOW | LOW-POWER MODE |

-continued

| INPUT | | OUTPUT |
|---|---|---|
| >3.3 V | HIGH | POWER SUPPLY UNIT SHUT OFF |
| 1 V-3.3 V | LOW | HIGH-POWER MODE |

According to the table, when the enable signal is not detected as indicated by the enable voltage being zero, the transistor 216 is shut off and the comparator 218 indicates that the reference voltage is greater than the enable voltage, so the power supply mode 200 operates in the low-power mode where electrical current is limited from being supplied to the connector 204. When the enable signal is detected and the enable voltage is greater than the transistor's threshold voltage (e.g., 1V) and less than or equal to the reference voltage (e.g., 3.3V), the transistor turns on and the output of the comparator remains low, so the power supply unit 200 operates in the high-power mode to supply electrical current to the connector 204 that is connected to the electronic device 206. When the enable signal is detected and the enable voltage is greater than the reference voltage, the comparator 218 goes high which triggers the latch circuit 222 to shut off the power supply unit 200.

Figure 3:
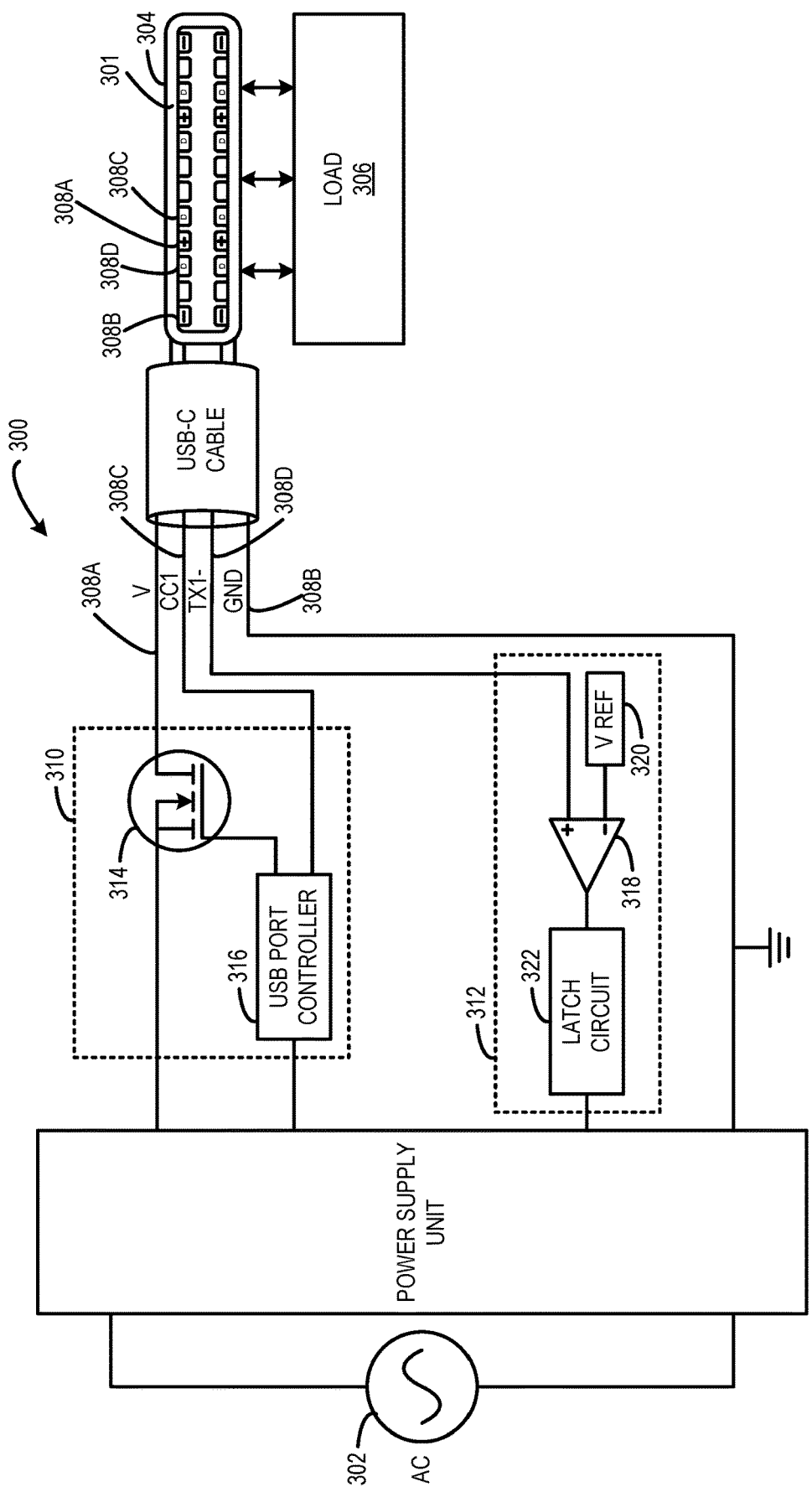
FIG. 3 schematically shows another example configuration of a power supply unit.

FIG. 3 schematically shows another example configuration of a a power supply unit 300. In this example, the power supply unit 300 includes a connector 304 that is configured as a universal serial bus (USB) connector. USB cables (with connectors) may have a standard or non-captive cable that can be disconnected from the power supply unit, and used to transfer data between devices or charge a device with another USB power supply unit or device that has the same type of USB connector. More particularly, the connector 304 is configured as a USB-C type connector. The USB C-type connector may be susceptible to environmental contamination where the power pin(s) short or partial short to the ground pin(s) through a metal shell 301 that encases the plurality of pins of the connector 304 or any of the ground pins (e.g., 308B).

The power supply unit 300 may be selectively electrically connected to a power source 302. The connector 304 may be configured to selectively connect to an electronic device 306 (depicted herein as a "load") via a plurality of electrically conductive pins 308. In particular, the connector 304 includes twenty-four electrically conductive pins encased in the metal shell 301. These electrically conductive pins include four power pins 308A, four ground pins 308B connected to a ground reference, and a plurality of data pins including a first data pin 308C and a second data pin 308D, as well as additional pins serving various other functions. The first data pin 308C and the second data pin 308D are positioned adjacent on each side of the power pin 308A. In particular, the first data pin 308C is a configuration channel line (CCl) and the second data pin 308D is a transfer line (TX-). Each of these data pins transfer different types of data between the power supply unit 300 and the electronic device 306. This pin arrangement is the same for each power pin in the connector 304. In one example, each of the first and second data pins 308C, 308D have a signal voltage less than or equal to 3.3 volts.

The power supply unit 300 includes a switching circuit 310 and a protection circuit 312. The switching circuit 310 is electrically connected between the power supply unit 300 and the power pin(s) 308A. The switching circuit 310 is further electrically connected to the first data pin(s) 308C—i.e., the configuration channel pin(s) CCl. The switching circuit 310 includes a transistor 314 electrically connected between the power supply unit 300 and the power pin(s) 308A. The transistor 314 includes a source, a gate, and a drain. The source is electrically connected to the power supply unit 300. The drain is connected to the power pin(s) 308A. The gate is electrically connected to a USB port controller 316. The USB port controller 316 is connected between the power supply unit 300 and the first data pin(s) 308C—i.e., the channel configuration pin(s) CC1. The USB port controller 316 may be configured to receive USB channel configuration information from the electronic device 306 via the first data pin(s) 308C based at least on the electronic device 306 being connected to the connector 300. The USB channel configuration information may dictate how the data transfer pin(s) 308D are configured for a particular type of connection. In accordance with such an arrangement, the USB port controller 316 is configured to send an activation signal to the gate of the transistor 314 in response to a data voltage of the first data pin(s) 308C being detected by USB port controller 316. The data voltage has to be less than a threshold voltage (e.g., 1V) of the USB port controller 316 in order for the USB port controller 316 to turn on the transistor 314. When the transistor 314 turns on, the supply current from the power supply unit 300 is allowed to flow through the transistor 314 to the power pin(s) 308A. In one example, the full power of the power supply unit 300 is 15 volts. It will be appreciated that the full power output from power supply unit 300 may have any suitable voltage.

In the depicted configuration, the switching circuit 310 is configured to limit the supply current from being provided from the power supply unit 300 to the power pin(s) 308A based at least on the data signal not being detected at the first pin(s) 308C. Additionally, the switching circuit 310 is configured to allow the supply current to be supplied from the power supply unit 300 to the power pin(s) 308A based at least on the data signal being detected at the first data pin(s) 308C.

The protection circuit 312 is electrically connected between the power supply unit 300 and the second data pin(s) 308D—i.e., the transfer line pin(s) TX-. The protection circuit 312 includes a comparator 318 including a first input and a second input. The comparator 318 may take any suitable form. The first input is electrically connected to the second data pin(s) 308D. The second input is electrically connected to a reference voltage 320. The reference voltage 320 corresponds to an expected voltage of the data signal for proper (e.g., non-contaminated) operating conditions of the connector 304. In one particular example, the reference voltage 320 is set at 3.3 volts. It will be appreciated that the reference voltage may be set at any suitable expected voltage for the data signal. The comparator 318 is configured to compare a voltage detected at the second data pin(s) 308D to the reference voltage 320 and output a digital signal indicating which voltage is greater. For example, the comparator 318 may output a digital signal corresponding to a zero based on the voltage detected at the second data pin(s) 308D being less than or equal to the reference voltage 320, or output a digital signal corresponding to a one based on the voltage detected at the second data pin(s) 308D being greater than the reference voltage 320.

The protection circuit 312 includes a latch circuit 322 electrically connected between the output of the comparator 318 and the power supply unit 300. The latch circuit 322 may take any suitable form. The latch circuit 322 is configured to shut off the power supply unit 300 in response to the comparator 318 outputting a signal indicating that the data voltage detected at the second data pin(s) 308D is greater than the reference voltage 320. For example, the latch circuit 322 may provide a low signal to the power supply unit 300 for as long as the comparator 318 outputs a signal indicating that the data voltage is less than or equal to the reference voltage 320. In response to the comparator 318 outputting a signal indicating that the enable voltage is greater than the reference voltage 320, the latch circuit 322 may switch from providing a low signal to providing a high signal to the power supply unit 300. This change from low to high may trigger a shutdown of the power supply unit 300.

In some implementations, the latch circuit 322 optionally may be configured to reset based on a power cycling of the power supply unit 300 and/or based on removing the short or partial short from the connector 304. Such a reset condition may indicate that the connector 304 has been restored to working order and is free from contamination. In other implementations, the connector 304 may remain inoperable once a contamination induced short condition is detected.

In some implementations, a switching circuit may be positioned electrically intermediate the power supply unit 300 and the connector 304. The switching circuit may be configured to electrically disconnect the power supply unit 300 from the connector 304 based at least in part on the data voltage at the second data pin(s) 308D being greater than the reference voltage 300.

Operation of the power supply unit 300 is characterized by the table depicted below.

| INPUT | | OUTPUT | |
|---|---|---|---|
| CC1 | TX1- | COMPARATOR | POWER SUPPLY UNIT OUTPUT |
| HIGH | DO NOT CARE | LOW | NO OUTPUT |
| LOW | <=3.3 V | LOW | OUTPUT ENABLED |
| LOW | >3.3 V | HIGH | POWER SUPPLY UNIT SHUT OFF |

According to the table, when the data signal (CC1) is high, indicating that the electronic device is not connected to the connector 304, the transistor is shut off and the comparator indicates that the reference voltage is greater than the data voltage, so the power supply unit 300 operates in a no power mode where electrical current is cut off from being supplied to the connector 304. When the CC1 signal is low and the TX1-signal voltage is less than or equal to the reference voltage, the transistor turns on and the output of the comparator remains low, so the power supply unit 300 operates in the high-power mode to supply electrical current from the power supply unit 300 through the connector 304 to the electronic device 306. When the CC1 signal is low and the TX1-signal voltage is greater than the reference voltage, the comparator goes high which triggers the latch circuit to shut off the power supply unit 300.

In the depicted USB-type connector configuration, by monitoring the voltage on the data pin(s) adjacent to the power pin(s) for contamination induced short conditions, it is possible to shut off the power supply unit in response to detection of such conditions in order to reduce the likelihood of the connector 304 overheating and/or degrading.

Figure 4:
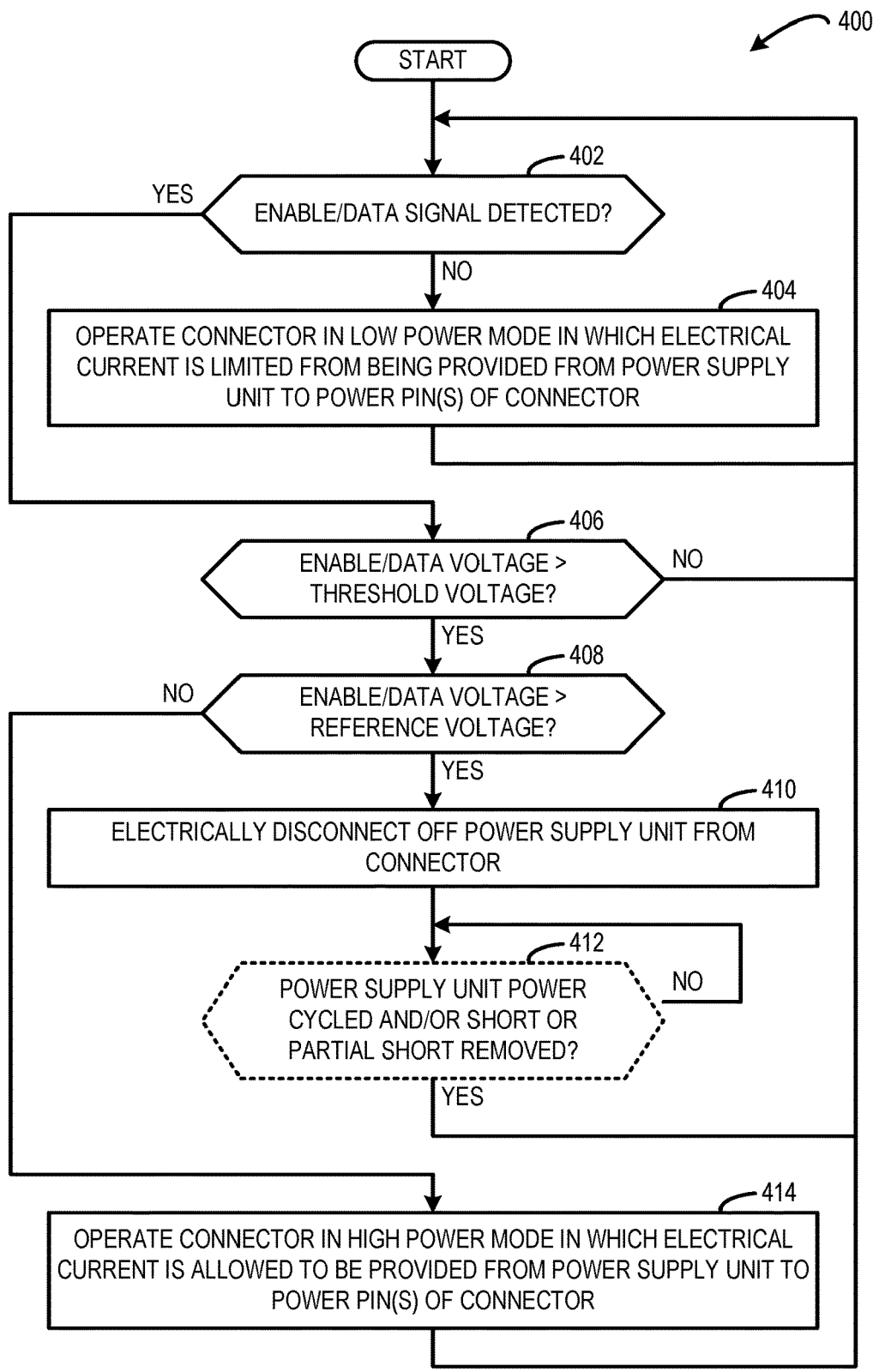
FIG. 4 shows aspects of a method for operating a power supply unit.

FIG. 4 shows aspects of a method 400 for operating a power supply unit. For example, the method 400 may be performed by the power supply unit 100 shown in FIG. 1, the power supply unit 200 shown in FIG. 2, and the power supply 300 shown in FIG. 3. At 402, the method 400 includes determining whether or not an enable/data signal is detected at one or more enable/data pins of the connector. If the enable/data signal is detected, then the method 400 moves to 406. Otherwise, if the enable/data signal is not detected, then the method 400 moves to 404. At 404, the method 400 includes operating the connector in a low-power mode in which electrical current is limited from being provided from the power supply unit to power pin(s) of the connector. While operating in the low-power mode, the method 400 repeatedly returns to 402 to poll for the enable/data signal.

At 406, the method 400 includes determining whether or not the enable/data voltage of the detected enable/data signal is greater than a threshold voltage of a transistor connected between the power supply unit and the power pin(s) of the connector. The threshold voltage is a minimum voltage at which the transistor turns on. If the enable/data voltage is greater than the threshold voltage, then the method 400 moves to 408. Otherwise, the method 400 returns to 402.

At 408, the method 400 includes determining whether or not the enable/data voltage of the detected enable/data signal is greater than a reference voltage. The reference voltage corresponds to an expected voltage of the enable signal for proper (e.g., non-contaminated) operating conditions of the connector. If the enable/data voltage is greater than the reference voltage, then the method 400 moves to 410. Otherwise, the method 400 moves to 414.

At 410, it has been determined that the enable/data voltage of the detected enable/data signal is greater than the reference voltage, which indicates that the connector has a short or partially pins, and the method 400 includes electrically disconnecting the power supply unit from the connector. In some examples, electrically disconnecting the power supply unit from the connector includes shutting off the power supply unit in order reduce the likelihood of overheating and/or degradation of the connector. In other examples, the power supply unit may be electrically disconnected from the connector using a switching circuit positioned electrically intermediate the power supply unit and the connector based at least in part on the enable/data voltage being greater than the reference voltage.

In some implementations, at 414, the method optionally may include determining whether or not the power supply unit has been power cycled to reset the power supply unit and/or removing the short or partial short from the connector. Power cycling of the power supply unit may indicate that the connector has been placed in working order and can return to normal operation. If it is determined that the power supply unit has been power cycled and/or removing the short or partial short from the connector, then the method 400 returns to 402. Otherwise, the method 400 returns to 412.

At 414, it has been determined that the enable/data voltage of the enable/data signal is within an expected voltage range, and the method 400 includes operating the connector in a high-power mode in which electoral current is allowed to be supplied from the power supply unit to the power pin(s) of the connector to power the electronic device connected to the connector.

In an example, a power supply unit comprises a connector selectively connectable to an electronic device, the connector including at least one power electrical contact and one or more additional electrical contacts configured to receive one or more signals indicating that the connector is electrically connected to the electronic device, each of the one or more signals having a same expected voltage, a switching circuit electrically connected between the power supply unit and the at least one power electrical contact and further electrically connected to at least one of the one or more additional electrical contacts, where the switching circuit is configured to limit a supply current from being provided from the power supply unit to the at least one power electrical contact based at least in part on the one or more signals not being detected by the switching circuit and allow the supply current to be supplied from the power supply unit to the at least one power electrical contact based at least in part on at least one signal of the one or more signals being detected by the switching circuit, and a protection circuit electrically connected to the power supply unit and at least one of the one or more additional electrical contacts and further electrically connected to a reference voltage corresponding to the expected voltage of the one or more signals, where the protection circuit is configured to electrically disconnect the power supply unit from the connector in response to a voltage at the at least one of the one or more additional electrical contacts being greater than the reference voltage. In this example and/or other examples, the switching circuit may be connected to an enable electrical contact and configured to detect an enable signal at the enable electrical contact, and the protection circuit may be configured to electrically disconnect the power supply unit from the connector by shutting off the power supply unit in response to a voltage of the enable signal being greater than the reference voltage. In this example and/or other examples, the switching circuit may include a current limiting resistor electrically connected between the power supply unit and the at least one power electrical contact, the current limiting resistor may be configured to limit the supply current from being provided from the power supply unit to the at least one power electrical contact. In this example and/or other examples, the switching circuit may include a transistor electrically connected in parallel with the current limiting resister, the transistor may include a gate electrically connected to the at least one of the one or more additional electrical contacts, the transistor may be configured to turn on in response to being supplied with the at least one of the one or more signals to short the current limiting resistor and allow the supply current to be supplied from the power supply unit to the power electrical contact. In this example and/or other examples, the protection circuit may include a comparator including a first input and a second input, the first input may be electrically connected to the at least one of the one or more additional electrical contacts, the second input may be electrically connected to the reference voltage, and the comparator may be configured to indicate whether or not the voltage of the at least one of the one or more additional electrical contacts is greater than the reference voltage. In this example and/or other examples, the protection circuit may include a latch circuit electrically connected between an output of the comparator and the power supply unit, the latch circuit may be configured to electrically disconnect the power supply unit from the connector by shutting off the power supply unit in response to the comparator outputting a signal indicating that the voltage of the at least one of the one or more additional electrical contacts is greater than the reference voltage. In this example and/or other examples, the latch circuit may be configured to reset based on a power cycling of the power supply unit and/or removal of a short or partial short from the connector. In this example and/or other examples, the connector may be a universal serial bus (USB) connector, the one or more additional electrical contacts may include a first data electrical contact and a second data electrical contact each positioned adjacent the at least one power electrical contact. In this example and/or other examples, the switching circuit may include a transistor electrically connected between the power supply unit and the power electrical contact, the transistor may include a gate electrically connected to a USB port controller circuit configured to turn on the transistor in response to receiving at least one of the one or more signals from the first data electrical contact to allow the supply current to be supplied from the power supply unit to the power electrical contact. In this example and/or other examples, the protection circuit may include a comparator including a first input and a second input, the first input may be electrically connected to the second data electrical contact, the second input may be electrically connected to the reference voltage, and the comparator may be configured to indicate whether or not the voltage of the second data electrical contact is greater than the reference voltage. In this example and/or other examples, the protection circuit may include a latch circuit electrically connected between an output of the comparator and the power supply unit, the latch circuit may be configured to electrically disconnect the power supply unit from the connector by shutting off the power supply unit in response to the comparator outputting a signal indicating that the voltage of the second data electrical contact is greater than the reference voltage. In this example and/or other examples, a supply voltage corresponding to the supply current may be greater than 3.3 volts and the reference voltage may be less than or equal to 3.3 volts.

In an example, a method for operating a power supply unit including a connector selectively connectable to an electronic device, the connector including at least one power electrical contact and one or more additional electrical contacts configured to receive one or more signals indicating that the connector is electrically connected to the electronic device, each of the one or more signals having a same expected voltage, comprises limiting a supply current from being provided from the power supply unit to the at least one power electrical contact based at least on the one or more signals not being detected on at least one of the one or more additional electrical contacts, allow the supply current to be supplied from the power supply unit to the at least one power electrical contact based at least in part on at least one signal of the one or more signals being detected on at least one of the one or more additional electrical contacts, comparing a voltage on at least one of the one or more additional electrical contacts to a reference voltage corresponding to an expected voltage of the one or more signals, and electrically disconnect the power supply unit from the connector based on the voltage on at least one of the one or more additional electrical contacts being greater than the reference voltage. In this example and/or other examples, the power supply unit may be electrically disconnected the power supply unit from the connector by shutting off the power supply unit via a latch circuit in response to the enable voltage being greater than the reference voltage. In this example and/or other examples, the latch circuit may be configured to reset based on a power cycling of the power supply unit and/or removal of a short or partial short from the connector. In this example and/or other examples, a supply voltage corresponding to the supply current may be greater than 3.3 volts and the reference voltage may be less than or equal to 3.3 volts. In this example and/or other examples, the connector may be a universal serial bus (USB) connector, the at least one of the one or more signals may be detected via a first data electrical contact positioned adjacent a power electrical contact in the USB connector, and the voltage may be measured at a second, different data electrical contact positioned adjacent the power electrical contact.

In an example, a power supply unit comprises a connector selectively connectable to an electronic device, the connector including at least one power electrical contact and at least one enable electrical contact or at least one data electrical contact configured to receive an enable signal or a data signal in response to the connector being electrically connected to the electronic device, a current limiting resistor electrically connected between the power supply unit and the at least one power electrical contact, where the current limiting resistor is configured to limit a supply current from being provided from the power supply unit to the at least one power electrical contact, a transistor electrically connected in parallel with the current limiting resister, the transistor including a gate electrically connected to the at least one enable electrical contact or the at least one data electrical contact, where the transistor is configured to turn on in response to the enable signal or the data signal being detected at the at least one enable electrical contact or the at least one data electrical contact to short the current limiting resistor and allow the supply current to be supplied from the power supply unit to the at least one power electrical contact, and a comparator including a first input, a second input, and an output, where the first input is electrically connected to at least one of the at least one enable electrical contact or the at least one data electrical contact, where the second input is electrically connected to a reference voltage, where the output is electrically connected to a latch circuit that is further electrically connected to the power supply unit, where the comparator is configured to trigger the latch circuit to shut off the power supply unit in response to an enable voltage of the enable signal or a data voltage of the data signal being greater than the reference voltage. In this example and/or other examples, the latch circuit may be configured to reset based on a power cycling of the power supply unit and/or removal of a short or partial short from the connector. In this example and/or other examples, a supply voltage corresponding to the supply current may be greater than 3.3 volts and the reference voltage may be less than or equal to 3.3 volts.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A power supply unit, comprising:
    a connector selectively connectable to an electronic device, the connector including at least one power electrical contact and one or more additional electrical contacts configured to receive one or more signals indicating that the connector is electrically connected to the electronic device, each of the one or more signals having a same expected voltage;
    a switching circuit electrically connected between the power supply unit and the at least one power electrical contact and further electrically connected to at least one of the one or more additional electrical contacts, where the switching circuit is configured to limit a supply current from being provided from the power supply unit to the at least one power electrical contact based at least in part on the one or more signals not being detected by the switching circuit and allow the supply current to be supplied from the power supply unit to the at least one power electrical contact based at least in part on at least one signal of the one or more signals being detected by the switching circuit; and a protection circuit electrically connected to the power supply unit and at least one of the one or more additional electrical contacts and further electrically connected to a reference voltage corresponding to the expected voltage of the one or more signals, where the protection circuit is configured to electrically disconnect the power supply unit from the connector in response to a voltage at the at least one of the one or more additional electrical contacts being greater than the reference voltage.

2. The power supply unit of claim 1, where the switching circuit is connected to an enable electrical contact and configured to detect an enable signal at the enable electrical contact, and where the protection circuit is configured to electrically disconnect the power supply unit from the connector by shutting off the power supply unit in response to a voltage of the enable signal being greater than the reference voltage.

3. The power supply unit of claim 1, where the switching circuit includes a current limiting resistor electrically connected between the power supply unit and the at least one power electrical contact, where the current limiting resistor is configured to limit the supply current from being provided from the power supply unit to the at least one power electrical contact.

4. The power supply unit of claim 3, where the switching circuit includes a transistor electrically connected in parallel with the current limiting resister, the transistor including a gate electrically connected to the at least one of the one or more additional electrical contacts, where the transistor is configured to turn on in response to being supplied with the at least one of the one or more signals to short the current limiting resistor and allow the supply current to be supplied from the power supply unit to the power electrical contact.

5. The power supply unit of claim 1, where the protection circuit includes a comparator including a first input and a second input, where the first input is electrically connected to the at least one of the one or more additional electrical contacts, where the second input is electrically connected to the reference voltage, and where the comparator is configured to indicate whether or not the voltage of the at least one of the one or more additional electrical contacts is greater than the reference voltage.

6. The power supply unit of claim 5, where the protection circuit includes a latch circuit electrically connected between an output of the comparator and the power supply unit, where the latch circuit is configured to electrically disconnect the power supply unit from the connector by shutting off the power supply unit in response to the comparator outputting a signal indicating that the voltage of the at least one of the one or more additional electrical contacts is greater than the reference voltage.

7. The power supply unit of claim 6, where the latch circuit is configured to reset based on a power cycling of the power supply unit and/or removal of a short or partial short from the connector.

8. The power supply unit of claim 1, where the connector is a universal serial bus (USB) connector, where the one or more additional electrical contacts include a first data electrical contact and a second data electrical contact each positioned adjacent the at least one power electrical contact.

9. The power supply unit of claim 8, where the switching circuit includes a transistor electrically connected between the power supply unit and the power electrical contact, where the transistor includes a gate electrically connected to a USB port controller circuit configured to turn on the transistor in response to receiving at least one of the one or more signals from the first data electrical contact to allow the supply current to be supplied from the power supply unit to the power electrical contact.

10. The power supply unit of claim 8, where the protection circuit includes a comparator including a first input and a second input, where the first input is electrically connected to the second data electrical contact, where the second input is electrically connected to the reference voltage, and where the comparator is configured to indicate whether or not the voltage of the second data electrical contact is greater than the reference voltage.

11. The power supply unit of claim 10, where the protection circuit includes a latch circuit electrically connected between an output of the comparator and the power supply unit, where the latch circuit is configured to electrically disconnect the power supply unit from the connector by shutting off the power supply unit in response to the comparator outputting a signal indicating that the voltage of the second data electrical contact is greater than the reference voltage.

12. The power supply unit of claim 1, where a supply voltage corresponding to the supply current is greater than 3.3 volts and the reference voltage is less than or equal to 3.3 volts.

13. A method for operating a power supply unit, the power supply unit including a connector selectively connectable to an electronic device, the connector including at least one power electrical contact and one or more additional electrical contacts configured to receive one or more signals indicating that the connector is electrically connected to the electronic device, each of the one or more signals having a same expected voltage, the method comprising:

limiting a supply current from being provided from the power supply unit to the at least one power electrical contact based at least on the one or more signals not being detected on at least one of the one or more additional electrical contacts;

allowing the supply current to be supplied from the power supply unit to the at least one power electrical contact based at least in part on at least one signal of the one or more signals being detected on at least one of the one or more additional electrical contacts;

comparing a voltage on at least one of the one or more additional electrical contacts to a reference voltage corresponding to an expected voltage of the one or more signals; and electrically disconnect the power supply unit from the connector based on the voltage on at least one of the one or more additional electrical contacts being greater than the reference voltage.

14. The method of claim 13, where the power supply unit is electrically disconnected the power supply unit from the connector by shutting off the power supply unit via a latch circuit in response to the enable voltage being greater than the reference voltage.

15. The method of claim 14, where the latch circuit is configured to reset based on a power cycling of the power supply unit and/or removal of a short or partial short from the connector.

16. The method of claim 13, where a supply voltage corresponding to the supply current is greater than 3.3 volts and the reference voltage is less than or equal to 3.3 volts.

17. The method of claim 13, where the connector is a universal serial bus (USB) connector, where the at least one of the one or more signals is detected via a first data electrical contact positioned adjacent a power electrical contact in the USB connector, and where the voltage is measured at a second, different data electrical contact positioned adjacent the power electrical contact.

18. A power supply unit comprising:
- a connector selectively connectable to an electronic device, the connector including at least one power electrical contact and at least one enable electrical contact or at least one data electrical contact configured to receive an enable signal or a data signal in response to the connector being electrically connected to the electronic device;
- a current limiting resistor electrically connected between the power supply unit and the at least one power electrical contact, where the current limiting resistor is configured to limit a supply current from being provided from the power supply unit to the at least one power electrical contact;
- a transistor electrically connected in parallel with the current limiting resister, the transistor including a gate electrically connected to the at least one enable electrical contact or the at least one data electrical contact, where the transistor is configured to turn on in response to the enable signal or the data signal being detected at the at least one enable electrical contact or the at least one data electrical contact to short the current limiting resistor and allow the supply current to be supplied from the power supply unit to the at least one power electrical contact; and
- a comparator including a first input, a second input, and an output, where the first input is electrically connected to at least one of the at least one enable electrical contact or the at least one data electrical contact, where the second input is electrically connected to a reference voltage, where the output is electrically connected to a latch circuit that is further electrically connected to the power supply unit, where the comparator is configured to trigger the latch circuit to shut off the power supply unit in response to an enable voltage of the enable signal or a data voltage of the data signal being greater than the reference voltage.

19. The power supply unit of claim 18, where the latch circuit is configured to reset based on a power cycling of the power supply unit and/or removal of a short or partial short from the connector.

20. The power supply unit of claim 18, where a supply voltage corresponding to the supply current is greater than 3.3 volts and the reference voltage is less than or equal to 3.3 volts.

* * * * *